United States Patent [19]

Paul

[11] Patent Number: 4,752,904

[45] Date of Patent: Jun. 21, 1988

[54] EFFICIENT STRUCTURE FOR COMPUTING MIXED-RADIX PROJECTIONS FROM RESIDUE NUMBER SYSTEMS

[75] Inventor: David F. Paul, Westmont, Ill.

[73] Assignee: International Business Machines Corporation, Armonk, N.Y.

[21] Appl. No.: 890,252

[22] Filed: Jul. 28, 1986

[51] Int. Cl.[4] .......................... G06F 7/72; G06F 11/00
[52] U.S. Cl. ..................................... 364/739; 235/310; 340/347 DD; 364/746
[58] Field of Search ...................... 364/739, 746, 737; 340/347 DD; 235/310, 311

[56] References Cited

U.S. PATENT DOCUMENTS

| 4,107,783 | 8/1978 | Huang | 364/746 |
| 4,281,391 | 7/1981 | Huang | 364/746 |
| 4,418,394 | 11/1983 | Tai | 364/746 |
| 4,458,327 | 7/1984 | McCoskey | 364/746 |
| 4,537,502 | 8/1985 | Miller et al. | 364/746 |

OTHER PUBLICATIONS

Barsi et al., Arithmetic Codes in Residue Number Systems with Magnitude Index, IEEE Trans. on Computers, vol. C-27, No. 12, Dec. 1978, pp. 1185-1188.

*Primary Examiner*—Charles E. Atkinson
*Attorney, Agent, or Firm*—J. Dennis Moore

[57] ABSTRACT

Apparatus for providing mixed-radix projection data from residue number systems data, while providing error detection and correction. A single array of ROMs and lacthes is provided, comprising the combination of each of N conventional MRC structures of size N-1, wherein the signal paths, latches and ROMs that are duplicative as between said structures are merged to eliminate the duplication.

1 Claim, 4 Drawing Sheets

EFFICIENT STRUCTURE FOR COMPUTING MIXED-RADIX PROJECTIONS FROM RESIDUE NUMBER SYSTEMS

BACKGROUND OF THE INVENTION

1. Field of the Invention

The present invention relates to an apparatus for providing mixed radix projection data from residue number systems data, and more particularly relates to a mixed radix conversion apparatus which provides for error detection and correction.

2. Background of the Invention

There has recently been a renewed interest in the application of residue arithmetic to digital signal processing ("DSP"). By computing DSP functions within a residue number system ("RNS"), the following advantages may be realized:

1. high sampling frequencies
2. modular implementation
3. fault tolerance.

Any DSP implementation which employs residue arithmetic requires the translation of its output from an RNS into a weighted number system ("WNS") while preserving the three advantages listed above.

For example, consider a multistage pipelined system with a cycle time of T seconds. Once every T seconds, a new input is accepted into each stage of the system. The input to the first stage is the system input. Once every T seconds, a new output is produced by each stage. The output of the last stage is the system output. The output of a given stage is the input to its succeeding stage. Each stage may itself be comprised of multiple stages.

FIG. 1 depicts a multistage pipelined system which may be used to process a computational workload. This system, as outlined below, utilizes the technique of redundant residue number system arithmetic to achieve the advantages of fast cycle time, modular implementation, and fault tolerance.

The system input is one or more integers represented within some weighted number system (WNS). The first stage 10 derives a residue number system (RNS) representation of the input integers, performs the necessary computations within this RNS, and produces the desired output in RNS form. The output 12 of the first stage is a set of N residue digits, $k_1$ through $k_N$, where N is the number of moduli upon which the RNS is defined. $k_N$ is the high-order residue digit, $k_1$ is the low-order residue digit. The RNS contains at least two redundant, high-order moduli to allow single-error correction to be performed on the output residue digits.

The second stage 14 produces N sets of $N-1$ mixed-radix digits. Each set is formed by ignoring the contribution of one of the $k_i$ while performing a mixed-radix conversion (MRC) on the remaining $N-1$ residue digits. The $N-1$ mixed-radix digits which result from this MRC are referred to as the ith projection. If none of the $k_i$ is in error, then each projection is a different WNS representation of the desired system output. In the presence of an erroneous residue digit $k_i$, exactly one of the projections will be a correct WNS representation of the desired system output—it will be the projection which was formed by ignoring the contribution of $k_i$. It is the second stage with which the invention is concerned.

The third stage 18 uses the output 16 of the second stage 14 to determine the correct output, if possible, and to provide any useful error information. The third stage may also convert the system output into a more convenient WNS representation.

Focusing on the specific computations of such a system, consider an RNS based upon the set of N relatively prime integers $$\{m_1, m_2, \ldots, m_N\}$$

which are referred to as the moduli of the RNS. The RNS representation of a natural integer k is written as $$[k_1, k_2, \ldots k_N]$$

where $k_i$ is termed a residue digit and represents the value k modulo $m_i$.

MRC is a useful technique for translating from an RNS into a WNS. An integer k may be represented by a series of weighted mixed-radix digits:

$$k = \sum_{i=1}^{N} d_i w_i \quad (1)$$

where $$w_i = \pi_{j=1}^{i-1} m_j \quad (2)$$

are the weights ($w_1 = 1$), and where the $d_i$ are the mixed-radix digits.

MRC may be implemented using an array comprised of Read-Only Memory ("ROM") modules and latches. This structure may be pipelined for increased throughput. FIG. 2 illustrates a prior art pipelined MRC structure which computes the mixed-radix digits, $d_i$, from the residue digits, $k_i$, for an RNS with N=4. ROMij stores the function $$r = ((p-q)m_j^{-1}) \text{modulo } m_i \quad (3)$$

where $m_j^{-1}$ is an integer such that $$(m_j^{-1} \times m_j) \text{modulo } m_i = 1.$$

Each ROM incorporates an input latch so that the structure is able to process a new set of residue digits every cycle. All latches are clocked together.

MRC structures not only provide translation from RNS to WNS, but also provide a self-checking means for performing error detection and correction—preserving the RNS advantages of modularity and fault-tolerance, as well as the advantage of high sampling frequency. As before, using an RNS with N moduli, of which at least 2 are redundant, it is possible to isolate, and correct for, an error in any one of the residue digits. This may be accomplished by using MRC structures to generate N mixed-radix projections from each set of residue digits. The $i^{th}$ mixed-radix projection is obtained by computing $N-1$ mixed-radix digits from a set of $N-1$ residue digits—the $i^{th}$ residue digit is omitted from the computation. Examination of the highest-order, mixed-radix digit of each projection allows identification of the faulty residue digit.

If a pipelined system is to produce one output every ROM cycle time, and if the system is also to demonstrate concurrent error detection, then all of the required mixed-radix projections must be computed in parallel during each cycle. This can be accomplished by fully replicating an MRC structure N times. The present invention provides a much more economical solution to this problem.

SUMMARY OF THE INVENTION

Therefore it is an object of the present invention to provide an improved apparatus for computing mixed-radix projection data from residue number system data. It is a further object of the invention to provide such an improved apparatus which provides error detection and correction using a more efficient structure than prior art apparatus.

In accordance with the present invention, an apparatus is provided for converting input data signals represented in a residue number system having N moduli to output mixed radix projection data signals. A single array of ROMs and latches comprising the combination of each of N conventional mixed-radix conversion structures of size N−1 is provided, wherein the signal paths, latches and ROMs that are duplicative as between said structures are merged to eliminate said duplication. Thus, the invention eliminates the redundant computations which exist when MRC structures are fully replicated. A much more economical solution is therefore provided to the problem of error correction and detection within apparatus that compute using residue number system data.

The foregoing and other objects, features and advantages of the invention will be apparent from the more particular description of the preferred embodiments of the invention, as illustrated in the accompanying drawings.

DETAILED DESCRIPTION OF THE PREFERRED EMBODIMENT OF THE INVENTION

Figure 1:
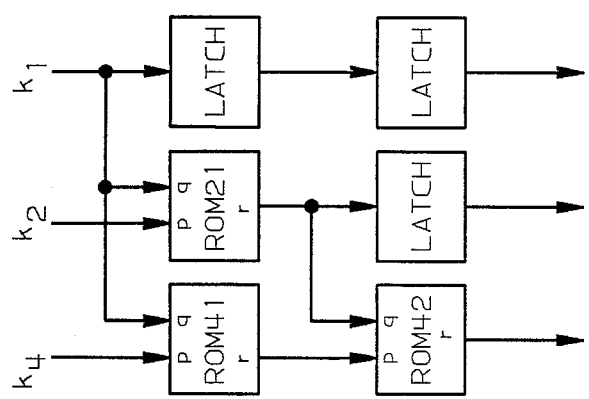
FIG. 1 depicts a prior art multi-stage pipelined system.
Figure 2:
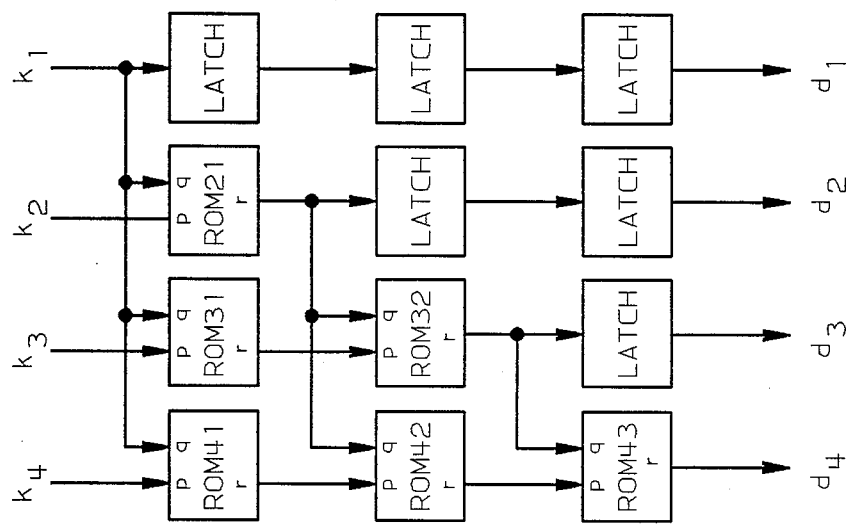
FIG. 2 illustrates a prior art pipelined mixed-radix conversion structure.
Figure 3:
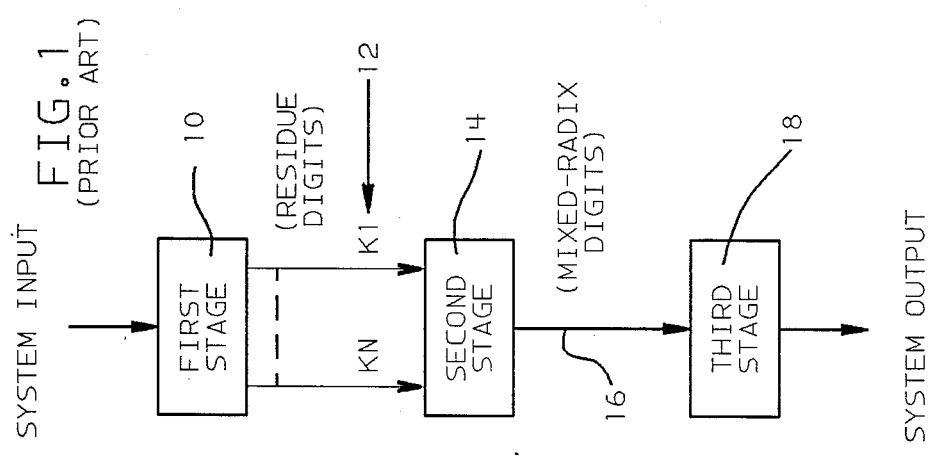
FIG. 3 illustrates one of four prior art mixed-radix conversion structures used in connection with error correction and detection.

The invention eliminates the redundant computations which exist when MRC structures are fully replicated. Replication requires N MRC structures—one to generate each of the N projections. For the case N=4, FIG. 3 shows an MRC structure which produces the mixed-radix digits for the $3^{rd}$ projection. For this case, replication requires three additional similar structures for a total of 12 ROMs and 12 latches.

Figure 4:
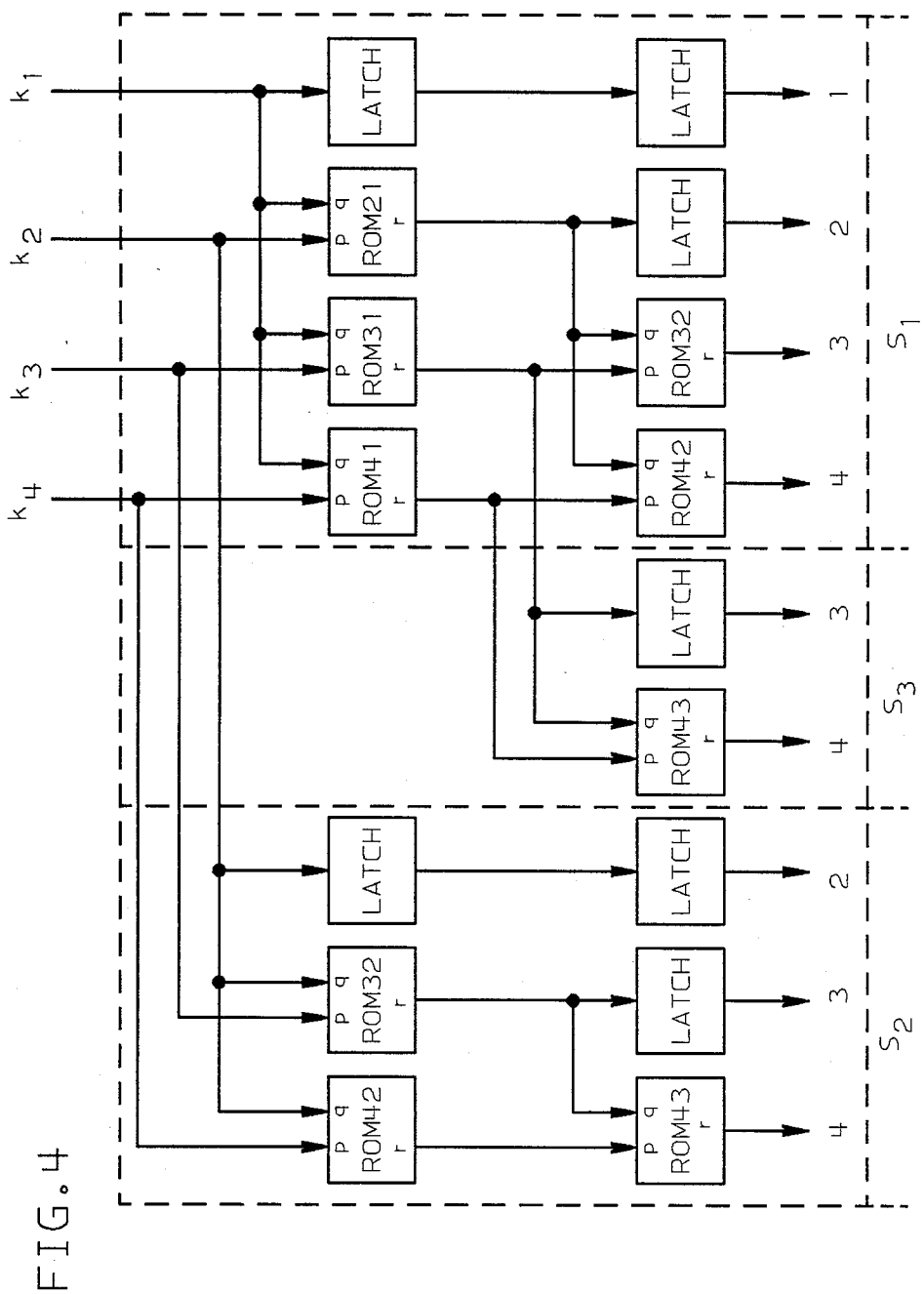
FIG. 4 is a mixed-radix conversion structure in accordance with the preferred embodiment of the present invention.

The preferred embodiment for the case N=4, as illustrated in FIG. 4, produces the same four projections using only 9 ROMs and 7 latches. The embodiment comprises a series of progressively smaller MRC structures, termed $S_1$ through $S_{N-1}$. $S_j$, in general, comprises N-j stages of ROMs and latches, with the exception of $S_1$ which is abbreviated by one stage. The length of the pipeline is therefore N−2 stages—the same as for the replication approach. The mixed-radix digits of the S structure outputs in FIG. 4 may be related to the prior art replication projections as follows:

$1^{st}$ projection = $\{S_2(4), S_2(3), S_2(2)\}$
$2^{nd}$ projection = $\{S_3(4), S_3(3), S_1(1)\}$
$3^{rd}$ projection = $\{S_1(4), S_1(2), S_1(1)\}$
$4^{th}$ projection = $\{S_1(3), S_1(2), S_1(1)\}$ where $S_j(i)$ indicates the $i^{th}$ output of structure $S_j$.

In general, simple replication uses A ROMs and A latches where $$A = N \sum_{i=1}^{N-2} (i) \qquad (4)$$
$$= N(N-1)(N-2)/2.$$

In general, the invention uses B−1 ROMs and B−(N−1) latches where $$B = \sum_{j=1}^{N-1} \sum_{i=1}^{j} (i)$$
$$= N(N-1)(N+1)/6.$$

Figure 5:
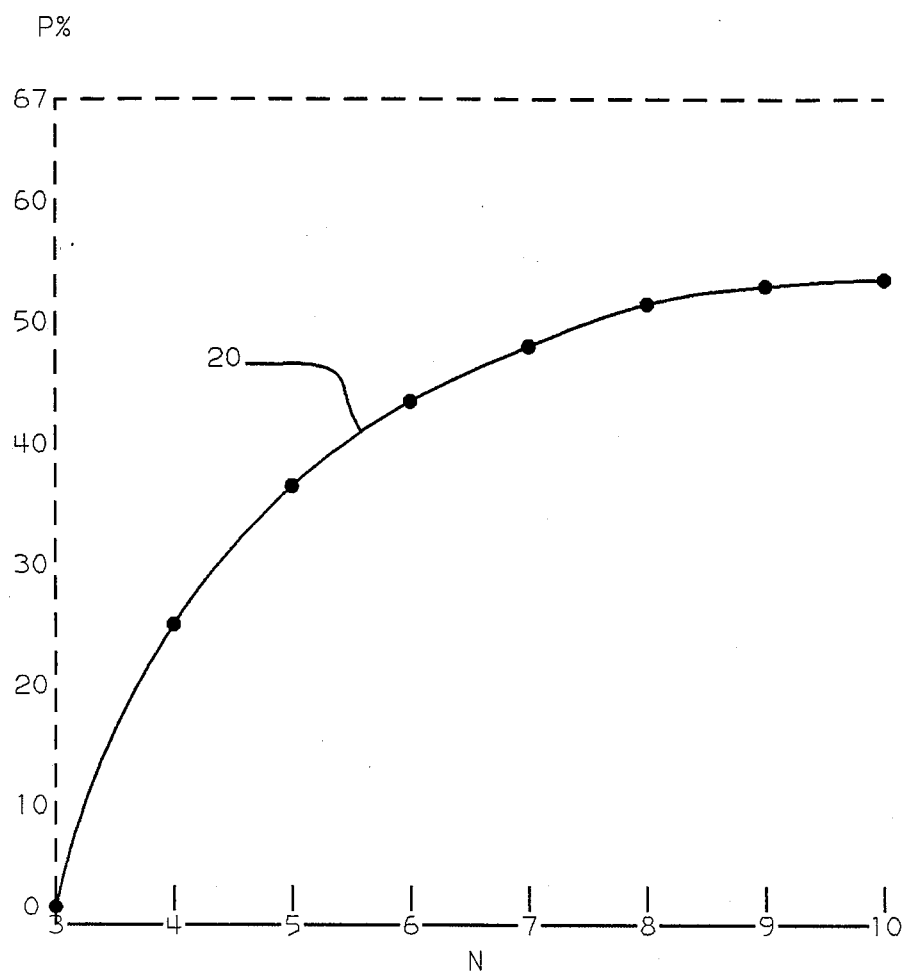
FIG. 5 is a graph illustrating the reduction in the required number of ROMs provided by the preferred embodiment of the present invention, for various values of N.

As a measure of the advantage obtained through the invention, one may compare the number of ROMs required for a given value of N. FIG. 5 shows a plot 20 of P versus N where $$P = 100 \times (1-(B-1)/A)$$

is the percent by which the required number of ROMs is reduced. For large N, P asymptotically approaches 67%.

In general, the preferred embodiment is an N−2 stage pipeline. Each stage is, in general, comprised of two types of elements: latches and ROMs. The latch captures its input at the beginning of a cycle and holds that value on its output for the remainder of the cycle. The ROM captures its inputs, p and q, at the beginning of a cycle and produces an output r before the end of the cycle. The output of a ROMij is determined by formula (3), above.

The preferred embodiment uses ROMs to implement the function described above. However, any circuit element or program may be substituted that provides the same function.

The preferred embodiment depicted in FIG. 4 is for the case N=4. According to the principles of the present invention, the case may be extended to any value of N. For the general case (N), the preferred embodiment will now be described.

Again, consider an RNS based upon the following set of N, pair-wise prime, integer moduli $$\{m_N, \ldots, m_2, m_1\}$$

where $m_{i+1} > m_i$.

Let k represent an integer such that $$k < \pi \prod_{i=1}^{N-2} m_i$$

The integer k may then be represented within the RNS by N residue digits $$k_N, \ldots, k_2, k_1$$

where
  $k_i$ represents the value
  k modulo $m_i$.

In this case, the RNS representation for the integer k incorporates 2 redundant residue digits. This redundancy allows the detection and correction of one erroneous residue digit in the RNS representation for k.

One technique for detecting and correcting errors in the RNS representation for an integer k involves MRC.

From a set of $k_i$, MRC will generate a set of $d_i$ in accordance with formulas (1) and (2), above. Erroneous residue digits may be detected as follows.

First, from the N residue digits representing the integer k, form N sets of N−1 digits by excluding one residue digit from each set. Each set is referred to as a projection. Let $P_i$ represent the projection which is formed by excluding $k_i$. Apply MRC to each $P_i$. Examine the high-order, mixed-radix digit for each $P_i$. If all have a value of zero, then no $k_i$ is erroneous. If all but $P_j$ are non-zero, then $k_j$ is in error and $P_j$ is the correct representation for k.

Let ROMij refer to any circuit or program which accepts two integers, p and q, as input at time 0 and produces, at time T, an output r as indicated in formula (3), above.

Let the term "latch" refer to any circuit or program which accepts an integer as input at time 0 and presents that same integer as output at time T.

Figure 6:
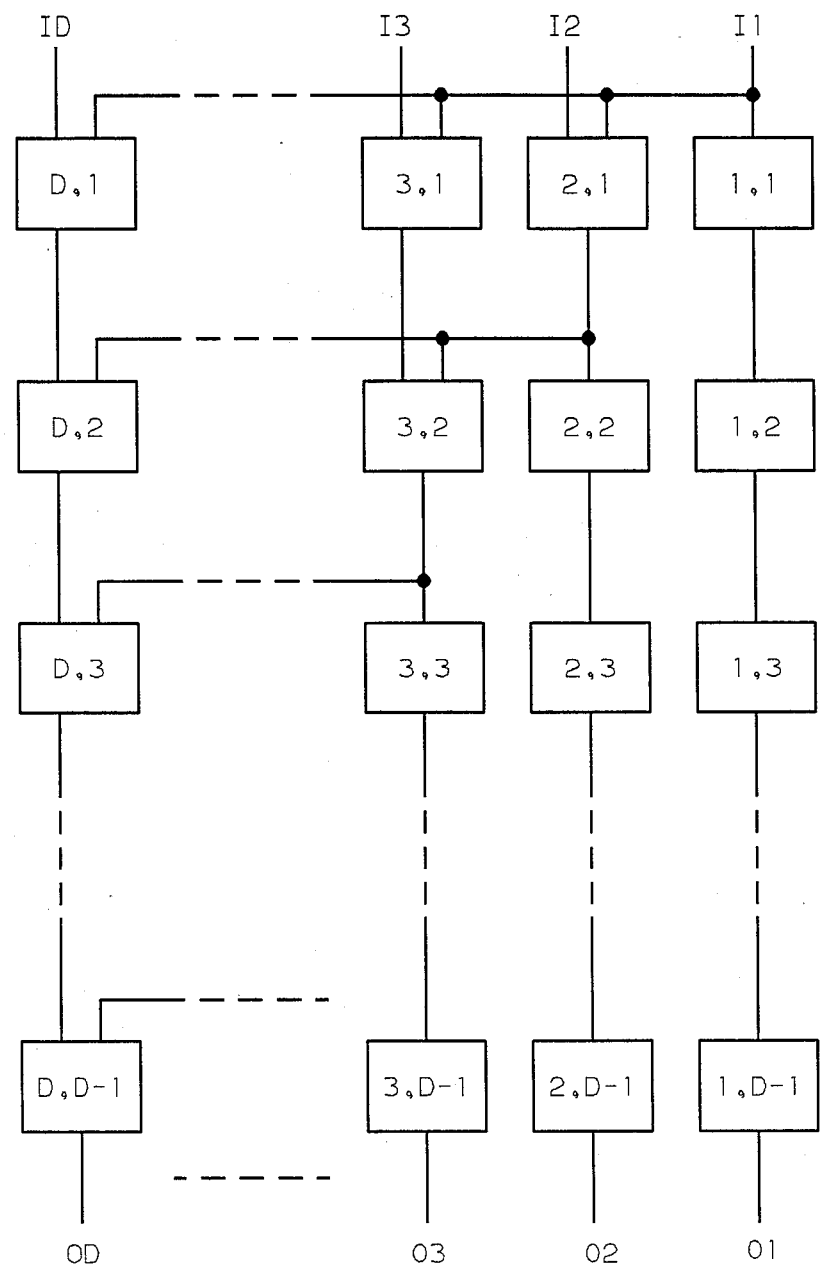
FIG. 6 is a generalized mixed-radix conversion structure used in the explanation of the generalized case of the preferred embodiment of the present invention.

ROMij's and latches, as defined above, may be placed and interconnected as in FIG. 6 to form a pipelined structure for executing MRC. The structure is termed an MRC structure of size D. The inputs of this structure are residue digits labeled I1 through ID and the outputs are mixed-radix digits labeled O1 through OD. A higher subscript indicates a higher-order digit. The D columns are referred to as 1 through D with column 1 accepting the lowest-order input. The D-1 pipelined stages are referred to as 1 through D-1 with stage 1 accepting the inputs. Each stage of the pipeline is cycled in time T. Each stage of the pipeline comprises a number of ROMij's and latches which accept their input from the previous stage and which present their output to the succeeding stage. Here, i, j indicates a ROMij if i>j, or a latch otherwise. The leftmost input to a ROMij is the p-input, and the rightmost is the q-input.

The preferred embodiment for the general case (N) is an N−2 stage pipeline containing B−1 ROMij's and B−N+1 latches where $$B = N(N-1)(N+1)/6.$$

The input of the embodiment is N residue digits and the output is (N+2)(N−1)/2 mixed-radix digits. The embodiment comprises N−1 MRC structures termed $S_1$ through $S_{N-1}$. The size of $S_i$ is N−i+1. The ROMij which occupies column x, stage y of $S_z$ is determined by $$i = x+z-1 \text{ and } j = y+z-1.$$

The inputs of $S_1$ are $k_1$ through $k_N$.

$S_1$ is a spcial case in that it is abbreviated by one stage; its outputs are presented after stage N−2. The outputs of $S_1$ are N mixed-radix digits termed $S_1(1)$ through $S_1(N)$.

The inputs of $S_i$, i>1, are the N−i+1 p-inputs of stage i−1 of $S_1$.

The outputs of $S_i$, i>1, are termed $S_i(i)$ through $S_i(N)$.

The outputs of the embodiment are necessary and sufficient to provide the mixed-radix representations of all projections. The mixed-radix digits of projection $P_N$ are $S_1(1)$ through $S_1(N-1)$. The mixed-radix digits of projection $P_{N-1}$ are $S_1(1)$ through $S_1(N-2)$ and $S_1(N)$.

The mixed-radix digits of projection $P_i$, i<N−1, are $S_1(1)$ through $S_1(i-1)$ (if i>1) and $S_{i+1}(i+1)$ through $S_{i+1}(N)$.

The preferred embodiment may be constructed as follows. First, the MRC is used to determine the N−1 mixed-radix digits to be computed for each of the N projections. Each digit is then expressed in terms of the resources (elements) necessary to compute it. This is shown below for the case N=4, where each digit is represented by an expression of the form (input)>latch or (p-input)(q-input)>ROM ij and where L="latch" and bij="ROMij", where the symbol ">" indicates that the term or terms to the left of the symbol are inputs to the element (ROM or latch) to the right of the symbol.

|  | 1st digit | 2nd digit | 3rd digit |
|---|---|---|---|
| 4th projection: | k1>L | k2k1>b21 | (k3k1>b31)(k2k1>b21)>b32 |
| 3rd projection: | k1>L | k2k1>b21 | (k4k1>b41)(k2k1>b21)>b42 |
| 2nd projection: | k1>L | k3k1>b31 | (k4k1>b41)(k3k1>b31)>b43 |
| 1st projection: | k2>L | k3k2>b32 | (k4k2>b42)(k3k2>b32)>b43 |

Second, the unique subexpressions are identified. These are indicated below with a "*" to the left of the subexpression.

|  | 1st digit | 2nd digit | 3rd digit |
|---|---|---|---|
| 4th projection: | k1>L | *k2k1>b21 | *(*k3k1>b31)(k2k1>b21)>b32 |
| 3rd projection: | k1>L | k2k1>b21 | *(*k4k1>b41)(k2k1>b21)>b42 |
| 2nd projection: | k1>L | k3k1>b31 | *(k4k1>b41)(k3k1>b31)>b43 |
| 1st projection: | k1>L | *k3k2>b32 | *(*k4k2>b42)(k3k2>b32)>b43 |

Third, the first stage of the embodiment is constructed by placing and connecting the elements indicated by the first-order (inner-most), unique subexpressions. In the example, these are k1>L, k2k1>b21, k3k1>b31, k4k1>b41, k2>L,
k3k2>b32, k4k2>b42.

Fourth, the second stage of the embodiment is constructed by placing and connecting the elements indicated by the second-order, unique subexpressions. In the example, these are (k3k1>b31) (k2k1>b21)>b32, (k4k1>b41)
(k2k1>b21>b42 (k4k1>b41) (k3k1>b31)>b43,
(k4k2>b42) (k3k2>b32)>b43.

This process is continued until all N−1 stages are constructed. Finally, latches are inserted where necessary to carry all mixed-radix digits through to the end of the pipeline.

The invention is applicable to any electronic, electromechanical, photo-electric, software, or other system which is used for numerical computation, signal processing, data encryption, data communications, or other purpose.

Thus, while the invention has been described primarily with respect to arrays of electronic ROMs and latches, elements that provide corresponding function in other media may be used to contruct the present invention, and are considered to be within the scope of the invention as claimed herein.

I claim:

1. Apparatus for converting input data signals represented in a redundant residue number system having N moduli, to output mixed-radix projection data signals from which error detection and correction information can be derived, comprising:

a set of $N-1$ arrays, $S_i$, where $i-1$ through $N-1$, each array $S_i$ comprising an MRC structure of size $N=i+1$, except for $S_1$ which comprises an MRC structure of size N but without the $N-1^{th}$ stage, the output thereof being provided after stage $N-2$; each said array $S_i$ having at array positions for which $i>j$ a ROMij, and having at all other array positions therein a latch, wherein said ROMij performs the operation $$r = [((p-1)m_j^{-1})]((p-q)m_j^{-1}) \text{modulo } m_i$$

where $m_j^{-1}$ is an integer such that $(m_j^{-1} \times m_j)$ modulo $m_j = 1$, r is the output, p is the higher order input and q is the other input of said ROMij, on the input data signals thereto, and wherein the ROMij which occupies column x, stage y of $S_z$ is determined by $i = x+z-1$ and $j = y+z-1$; wherein the inputs to said $S_1$ array are $k_1$ through $k_N$ and the outputs thereof are N mixed radix digits, $S_1(1)$ through $S_1(N)$; and wherein the inputs to all other $S_i$ arrays are the $N-i+1$ p-inputs of Stage $i-1$ of $S_1$, and the outputs thereof are mixed radix digits $S_i(i)$ through $S_i(N)$ whereby the mixed-radix representation of each of the N projections of the input residue number are available for subsequent identification of erroneous residue digits.

* * * * *